United States Patent
Mooring et al.

(10) Patent No.: US 8,328,942 B2
(45) Date of Patent: Dec. 11, 2012

(54) WAFER HEATING AND TEMPERATURE CONTROL BY BACKSIDE FLUID INJECTION

(75) Inventors: Ben Mooring, Austin, TX (US); John Parks, Hercules, CA (US); Diane J. Hymes, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 796 days.

(21) Appl. No.: 11/015,968

(22) Filed: Dec. 17, 2004

(65) Prior Publication Data

US 2006/0130762 A1    Jun. 22, 2006

(51) Int. Cl.
*C23C 16/00* (2006.01)

(52) U.S. Cl. .............. 118/724; 156/345.52; 156/345.53; 219/390; 432/247

(58) Field of Classification Search .................. 134/902, 134/87, 199, 200, 50, 88, 94.1; 156/345, 156/345.2, 345.52, 345.53, 345.11, 345.17, 156/345.23, 345.34; 118/725; 432/247, 432/253; 219/390, 405, 443.1
See application file for complete search history.

(56) References Cited

U.S. PATENT DOCUMENTS

| | | | | |
|---|---|---|---|---|
| 6,097,005 A * | 8/2000 | Akimoto | | 219/444.1 |
| 6,248,398 B1 * | 6/2001 | Talieh et al. | | 427/240 |
| 6,315,832 B1 * | 11/2001 | Liu | | 118/602 |
| 6,350,319 B1 * | 2/2002 | Curtis et al. | | 118/715 |
| 6,431,190 B1 * | 8/2002 | Oka et al. | | 134/148 |
| 6,782,900 B2 * | 8/2004 | DeYoung et al. | | 134/105 |
| 7,392,815 B2 * | 7/2008 | Parks | | 134/199 |
| 2003/0116176 A1 * | 6/2003 | Rothman et al. | | 134/1.3 |
| 2004/0163764 A1 * | 8/2004 | Collins et al. | | 156/345.48 |
| 2005/0034674 A1 * | 2/2005 | Ono | | 118/728 |

* cited by examiner

*Primary Examiner* — Sylvia R. MacArthur
(74) *Attorney, Agent, or Firm* — Martine Penilla Group, LLP

(57) ABSTRACT

In one of the many embodiments, an apparatus for processing a substrate is provided which includes a substrate processing chamber where the substrate is positioned within the substrate processing chamber so the substrate at least partially separates the substrate processing chamber into a first chamber and a second chamber. The apparatus further includes a first chamber inlet configured to input a first fluid of a first temperature into the first chamber at a first pressure and a second chamber inlet configured to input a second fluid of a second temperature into the second chamber at a second pressure wherein the first pressure and the second pressure are substantially equal. The second temperature is capable of being utilized to manage substrate temperature.

23 Claims, 7 Drawing Sheets

WAFER HEATING AND TEMPERATURE CONTROL BY BACKSIDE FLUID INJECTION

BACKGROUND OF THE INVENTION

1. Field of the Invention

The present invention relates to semiconductor wafer processing and, more particularly, to apparatuses and techniques for more efficiently applying fluid to the backside of the wafer to heat the wafer for efficiently processing the wafer.

2. Description of the Related Art

In the semiconductor chip fabrication process, it is well-known that there is a need to process wafers in the production of semiconductor devices. In such production operations, utilization of certain temperatures is often crucial for proper wafer production. Unfortunately, temperature control is often difficult to attain due to the configuration of the apparatus or chamber used for wafer processing. For example, in some instances, wafer heating may be conducted by heat lamps or wafer heating plates. Unfortunately heat lamps are difficult to use in high pressure processing environments due to problems with heat lamp degradation. In addition, outside heat lamps can shine heat into a wafer processing chamber through glass capable of transmitting heat. Unfortunately, in high pressure wafer processing environments, such outside heat lamps typically cannot be used due to the extremely thick glass that is often required to withstand the high pressures inside of the chamber. Wafer heating plates are often undesirable due to uneven heating of the wafer because of wafer and/or heating plate surface irregularities. Consequently, certain process conditions often make controlling the temperature within an apparatus or chamber difficult or even impossible with use of the prior art temperature control methods and apparatuses.

Therefore, there is a need for a method and an apparatus that avoids the prior art by enabling optimized wafer heating in a high pressure wafer processing conditions.

SUMMARY OF THE INVENTION

Broadly speaking, the present invention fills these needs by providing a substrate processing apparatus that is capable of intelligently heating the substrate in a high pressure environment. It should be appreciated that the present invention can be implemented in numerous ways, including as a process, an apparatus, a system, a device or a method. Several inventive embodiments of the present invention are described below.

In one embodiment, an apparatus for processing a substrate is provided which includes a substrate processing chamber where the substrate is positioned within the substrate processing chamber so the substrate at least partially separates the substrate processing chamber into a first chamber and a second chamber. The apparatus further includes a first chamber inlet configured to input a first fluid of a first temperature into the first chamber at a first pressure and a second chamber inlet configured to input a second fluid of a second temperature into the second chamber at a second pressure wherein the first pressure and the second pressure are substantially equal. The second temperature is capable of being utilized to manage substrate temperature.

In another embodiment, a method for processing a substrate in a substrate processing chamber is provided. In one embodiment, the substrate processing chamber includes a first chamber and a second chamber, a first surface of the substrate being exposed to the first chamber and a second surface of the substrate being exposed to the second chamber. The method includes applying a first fluid to the first surface of the substrate where the first fluid is at a first temperature and at a first fluid pressure. The method further includes applying a second fluid to the second surface of the substrate where the second fluid is at a second temperature and at second fluid pressure. The first fluid pressure is substantially equal to the second fluid pressure and the second temperature being at a higher temperature than the first temperature wherein the second fluid heats the substrate during a substrate processing operation.

In yet another embodiment, an apparatus for processing a substrate is provided. The apparatus includes a substrate processing chamber where the substrate separates the substrate processing chamber into a top chamber and a bottom chamber. The apparatus further includes a top chamber inlet configured to input a wafer processing fluid of a first temperature into the top chamber at a first pressure. The apparatus also includes a bottom chamber inlet configured to input a wafer temperature controlling fluid of a second temperature into the bottom chamber at a second pressure wherein the first pressure and the second pressure are substantially equal.

The advantages of the present invention are numerous. Most notably, the apparatuses and methods described herein utilize an intelligent and powerful method and apparatus for processing a substrate using controlled heating. In one embodiment, a wafer processing apparatus such as a super critical $CO_2$ module is used which utilizes high pressure fluids to process the substrate. The wafer processing apparatus can have a wafer processing chamber which is separated into a top chamber and a bottom chamber with respective inlets and outlets. A wafer processing fluid can be introduced into the top chamber and a wafer temperature controlling fluid can be introduced into the bottom chamber for managing the temperature of the wafer processing environment. In one embodiment the substrate separates the top chamber and the bottom chamber. In such a way, by inputting a higher temperature fluid into the bottom chamber, the higher temperature fluid can be applied to a bottom surface of the substrate to generate wafer heating.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the specifications and studying the drawings will realize various alterations, additions, permutations and equivalents thereof. It is therefore intended that the present invention includes all such alterations, additions, permutations, and equivalents as fall within the true spirit and scope of the invention.

It should be appreciated the apparatuses and methods described herein may process any suitable type of substrate such as, for example, a wafer. In general terms, wafer temperature control may be used for wafer processing operations. In one example, to achieve proper process conditions in a super critical $CO_2$ module, a wafer may be uniformly heated to a temperature of about 250 degrees Celsius (C.) to process the wafer in a desired manner. The super critical $CO_2$ module may have a first chamber where a surface of the wafer to be processed is exposed to super critical $CO_2$ which can carry a processing fluid into a processing chamber for a desired wafer processing operation(s) such as, for example, cleaning, low K wafer repair, copper barrier layer deposition, copper seed layer deposition, and deposition of bulk copper. Exemplary processing fluids can include $CO_2$ with a wide range of dissolved materials intended to accomplish the process(es) defined above. To control temperature in such an operation, a temperature control fluid (e.g., any suitable fluid that can be heated and is compatible with the wafer material utilized) may be introduced into a second chamber separated from the first chamber. In one exemplary embodiment, $CO_2$ may be utilized as the temperature control fluid. In embodiment, a backside of the wafer is exposed in the second chamber. Therefore, by controlling the temperature of the fluid that is applied to the backside of the wafer, wafer temperature may be intelligently controlled.

Figure 1:
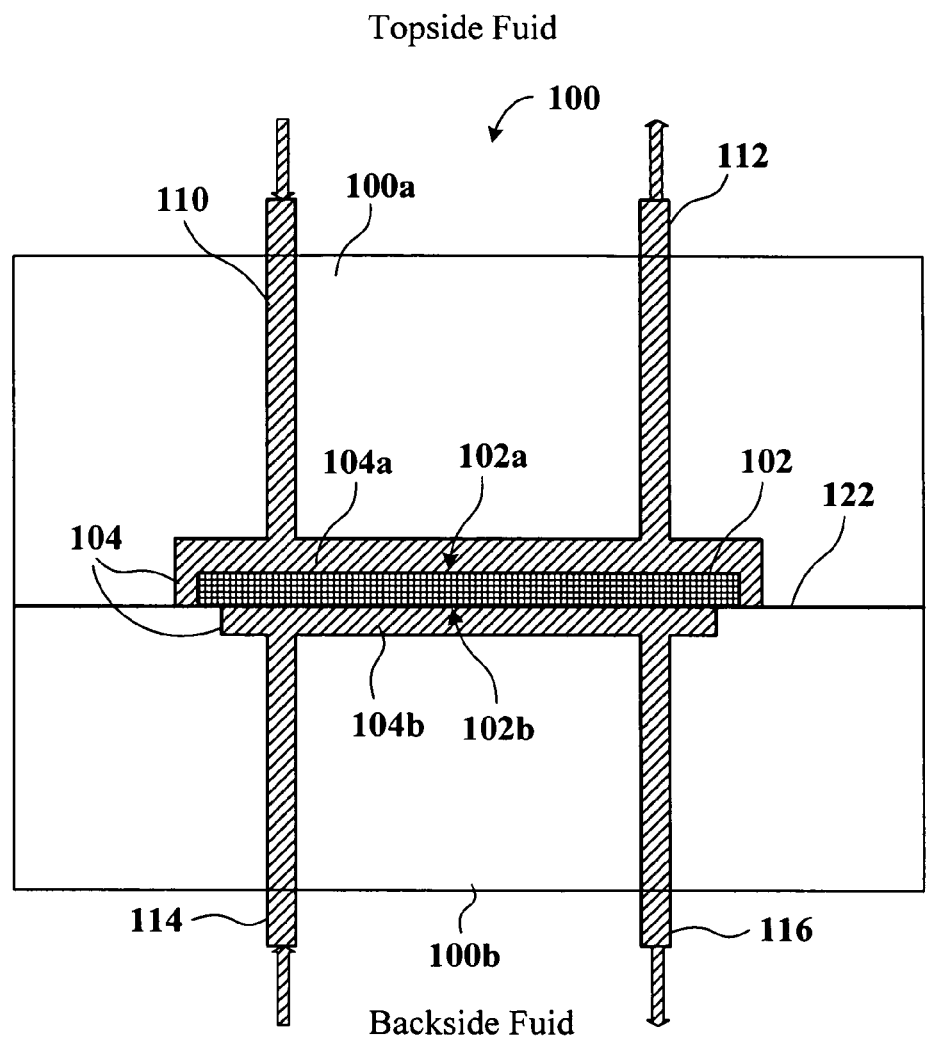
FIG. 1 shows a side view of a wafer processing apparatus in accordance with one embodiment of the present invention.

FIG. 1 shows a side view of a wafer processing apparatus 100 in accordance with one embodiment of the present invention. In one exemplary embodiment, the wafer processing apparatus 100 includes a wafer processing chamber 104 defined within the apparatus 100. The wafer processing apparatus 100 may be made from any suitable material that is compatible with the wafer processing operations desired to be conducted. In one embodiment, the wafer processing apparatus 100 may be made from stainless steel. In an exemplary embodiment, the wafer processing chamber 104 may be divided by joining surface 122 into a top chamber 104a and a bottom chamber 104b.

It should be appreciated that the wafer processing apparatus 100 may be configured and/or structured in any suitable way that is consistent with the embodiments shown and/or discussed herein. In one embodiment, the wafer processing apparatus 100 may include a top piece 100a and a bottom piece 100b where when combined, the wafer processing apparatus 100 may be generated. Therefore, in an exemplary embodiment, indentations and inputs may be defined within the two pieces to generate the wafer processing chamber 104. In other embodiments, the wafer chamber may be split up into any suitable number of components such as, for example, 1, 2, 3, 4, 5, 6, 7, 8, 9, 10, etc.

A wafer 102 may located within the wafer processing chamber 104 in such a way that the wafer 102 may separate the top chamber 104a and the bottom chamber 104b. Therefore, any fluid introduced into the top chamber 104a may act upon a top surface 102a of the wafer 102. In addition, any fluid introduced into the bottom chamber 104b may act upon the bottom surface 102b of the wafer 102. In one embodiment, the top chamber 104a and the bottom chamber 104b is separated in such a way that fluid within the top chamber 104a and fluid within the bottom chamber 104b do not intermingle. It should be appreciated that the size(s) of the chambers 104a and 104b may be any suitable size that enables the wafer 102 to be processed and the temperature of the wafer 102 to be managed consistent with the methodologies described herein.

The wafer processing apparatus 100 can also include any suitable number of inlets and outlets as long as a first fluid may be introduced into the top chamber 104a and a second fluid may be introduced into the bottom chamber 104b. In one embodiment, an inlet 110 may be defined within the wafer processing chamber 100 and configured to supply the top chamber 104a with the first fluid. An outlet 112 may be defined within the wafer processing chamber 100 and configure to remove the first fluid from the top chamber 104a. An inlet 114 may be defined within the wafer processing apparatus 100 and configured to supply the bottom chamber 104b with the second fluid. In addition, an outlet 116 may be defined within the wafer processing apparatus 100 and configured to remove the second fluid from the bottom chamber 104b.

In operation, the first fluid may be introduced into the top chamber 104a and the second fluid may be introduced into the bottom chamber 104b. In one embodiment, the first fluid may be configured to process a top surface of the wafer 102. In such an example, the first fluid may be any suitable type of processing fluid corresponding to the type of processing operation to be conducted on the wafer surface. When the apparatus 100 is a super critical $CO_2$ chamber, the first fluid may be a super critical $CO_2$ where the super critical $CO_2$ fluid serves as a carrier for a processing fluid. Consequently, in such an embodiment, the first fluid may be a combination of super critical $CO_2$ fluid and the processing fluid.

In one exemplary embodiment, the top chamber 104a and the bottom chamber 104 can be separated from each other by the wafer 102 as shown in FIG. 1. Therefore, in operation, the first fluid in the top chamber 104a and the second fluid in the bottom chamber 104b are separated.

In one embodiment, the fluid pressure of the first fluid being applied to the top surface 102a of the wafer 102 may be substantially identical to the fluid pressure of the second fluid being applied to the bottom surface 102b of the wafer 102. In such a way, the position of the wafer 102 is stabilized. In addition, because the top chamber 104a and the bottom chamber 104b may be separated by the wafer 102, the first fluid does not intermingle with the second fluid. Therefore, the first fluid and the second fluid may be different in composition and/or characteristic. In such a way, as discussed below, when different temperature fluid is introduced into the bottom chamber 104b, the temperature of the top chamber 104a may not be affected.

In one embodiment a region of the apparatus surrounding the bottom chamber 104b may be insulated (as discussed below in further reference to FIG. 3) so if the temperature of fluid within the bottom chamber 104b is changed this may not affect the temperature of the fluid in the top chamber 104a. Consequently, wafer processing fluid in the top chamber 104a may be kept at a particular temperature while the wafer can be at a different temperature due to the different temperature of the fluid in the bottom chamber 104b.

In one embodiment, temperature of the first fluid introduced into the top chamber 104a may be independently controlled from the temperature of the second fluid introduced into the bottom chamber 104b. It should be appreciated that the temperature of the fluid introduced to the chambers 104a and 104b may be managed and controlled by any suitable manner. In one embodiment, a manifold may be utilized which can control the inputs into the top chamber 104a and the bottom chamber 104b in an independent manner. To control the temperature of the fluids, any suitable type of temperature detector and fluid heater may be utilized. In one embodiment, the temperature of the first fluid may be between about 20 degrees C. and about 100 degrees C. and the temperature of the second fluid may be between about ambient room temperature and about 400 degrees C. It should be appreciated that ambient room temperature may vary depending on the conditions of the location where the apparatus 100 is located. In one embodiment, ambient room temperature may be between 10 degrees C. and about 35 degrees C.

It should be appreciated that the pressure in the wafer processing environment may be any suitable pressure depending on the type of wafer processing operations being conducted. For example, when the apparatus 100 is a super critical $CO_2$ chamber, the wafer processing environment (e.g., the chamber 104) may be between about 2100 pounds per square inch (PSI) to about 5000 PSI while in a preferable embodiment, the pressure is about 3000 PSI. In another embodiment, the pressures of a first fluid in the first chamber and a second fluid in the second chamber may be in a range consistent with $CO_2$ in supercritical state. It should also be appreciated that the temperature of the wafer processing environment may be any suitable temperature desired for wafer processing.

Figure 2:
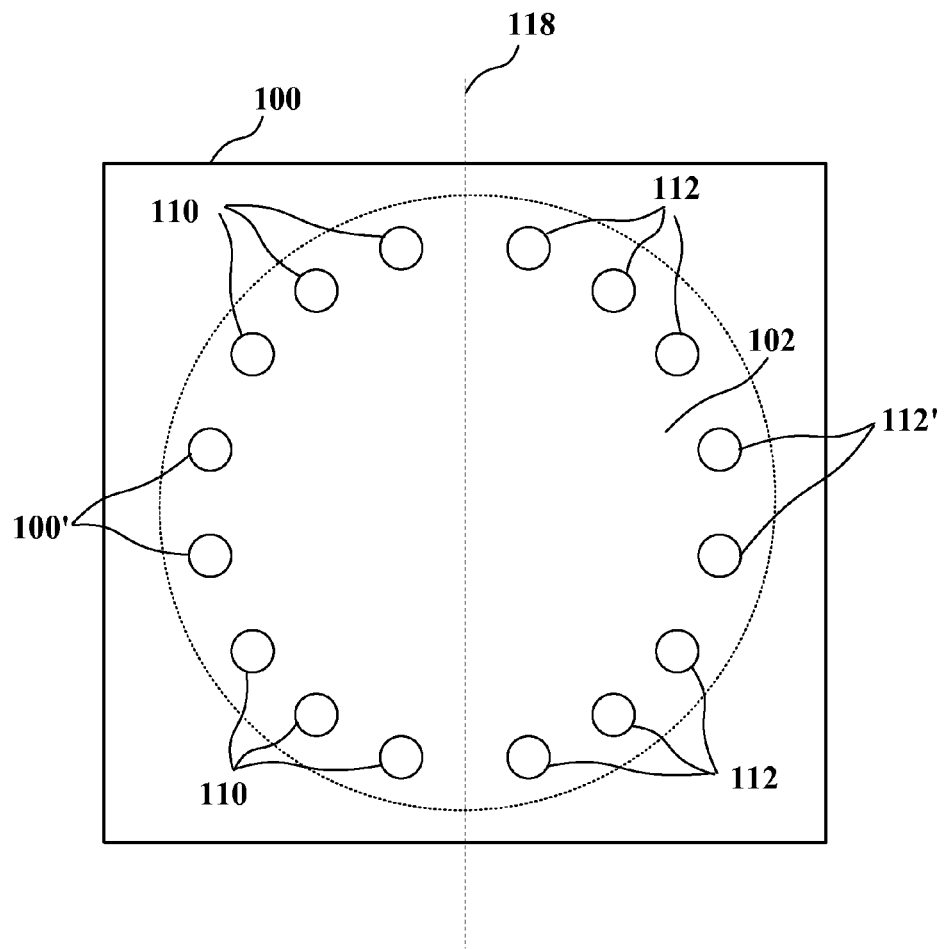
FIG. 2 illustrates a top view of the wafer processing apparatus in accordance with one embodiment of the present invention.

FIG. 2 illustrates a top view of the wafer processing apparatus 100 in accordance with one embodiment of the present invention. It should be appreciated that any suitable number and/or configuration of the inlets 110 and the outlets 112 may be utilized which would enable a flow of fluid from one perimeter edge of the wafer 102 to another perimeter edge of the wafer 102. It should also be appreciated that any suitable complementary group of the inlets 114 and outlets 116 may be located on the other side of the wafer from a bottom view of the wafer processing apparatus 100.

In one embodiment, inlets 110' that input fluid that have to traverse a longer distance to the outlets 112' based on a diameter 118 may be made larger in size so more fluid can be introduced into those regions. Moreover, the outlets 112' that receive more fluid can be made larger than other outlets 112 that receive less fluid. In one embodiment, all of the openings on one side the diameter 118 may be inlets 110 and all of the other openings on the other side of the diameter 118 may be outlets 112. In such a configuration, corresponding inlets 114 and outlets 116 complementary to the inlets 110 and 112 may be exist to apply temperature control fluid to the opposite surface of the wafer 102.

Figure 3:
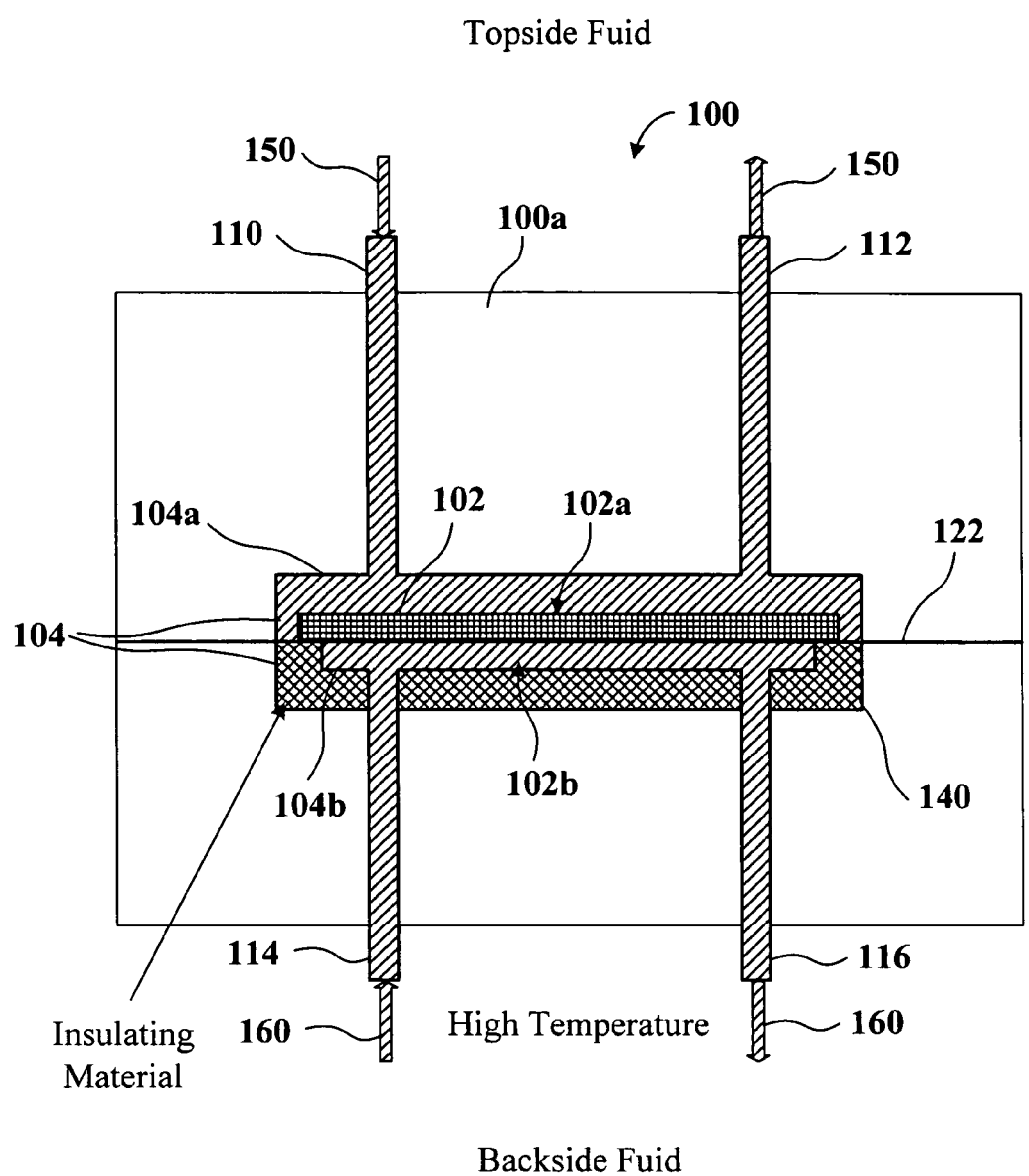
FIG. 3 illustrates the wafer processing apparatus where a higher temperature fluid is introduced into the bottom chamber in accordance with one embodiment of the present invention.

FIG. 3 illustrates a side view of the wafer processing apparatus 100 where a higher temperature fluid 160 is introduced into the bottom chamber 104b in accordance with one embodiment of the present invention. In one embodiment, when the wafer is desired to be heated, the heated fluid 160 may be introduced into the bottom chamber 104b through the inlet 114. Therefore, the fluid in the bottom chamber 104b may become heated thereby heating the wafer in a substantially even manner. In this embodiment, the fluid 160 introduced into the bottom chamber 104b may be a temperature controlling fluid and a fluid 150 introduced into the top chamber of the apparatus 100 may be a processing fluid in combination with a carrier fluid such as, for example, super critical $CO_2$. It should be appreciated that although the top chamber 104a is depicted as the chamber where wafer processing is conducted, if a bottom surface of the wafer 102 is desired to be processed, the bottom chamber 104b could receive the wafer processing fluid 150 and the top chamber 104a can receive the temperature controlling fluid 160 to manage the wafer temperature.

It should be appreciated that depending on the temperature desired for a particular wafer processing operation, the fluid introduced into the bottom chamber 104b may be any suitable temperature. In one embodiment, the temperature of the wafer processing environment may be between about ambient room temperature (e.g., about 10 degrees C. to about 35 degrees C.) and about 400 degrees C. and in a preferable embodiment, the temperature may be about 300 degrees C. Therefore, in such circumstances, the temperature of the fluid 160 introduced into the bottom chamber 104b may be adjusted accordingly to obtain the desired wafer processing environment. Consequently, as the fluid in the bottom chamber 104b moves over the bottom surface 102b of the wafer 102, the wafer 102 may become heated to the temperature of the fluid 160.

In one embodiment, the bottom chamber 104b may optionally be at least partially surrounded by an insulating material 140. In one embodiment, the insulating material 140 may separate the fluid 160 from walls of the bottom chamber 104b. In such a way, the apparatus 100 may be kept at a temperature substantially lower than the fluid 160. By keeping the temperature of the apparatus 100 relatively constant, the apparatus 100 does not serve as a heat sink. Consequently, the apparatus 100 may not affect the temperature of the chamber 104 in an adverse way. In addition, time for decreasing the temperature of the chamber 104 after processing has completed may be substantially less because the apparatus 100 would not have a substantial amount stored heat energy which would otherwise have to be accounted for. In such a way, temperature isolation may be generated so the apparatus the wafer processing environment can have different temperatures.

Figure 4:
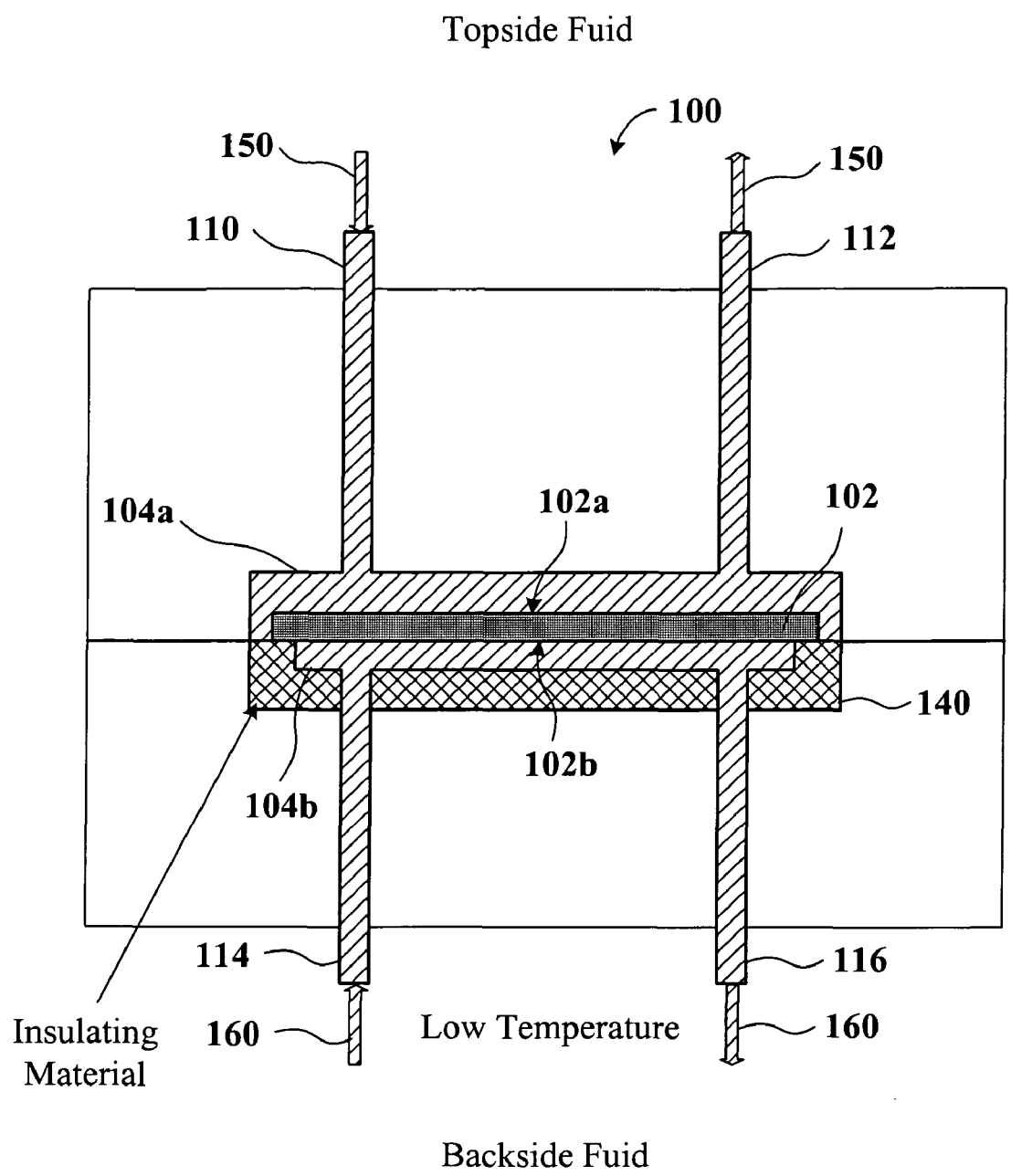
FIG. 4 shows the wafer processing apparatus where a lower temperature fluid is introduced into the bottom chamber in accordance with one embodiment of the present invention.

FIG. 4 shows a side view of the wafer processing apparatus 100 where a lower temperature fluid is introduced into the bottom chamber 104b in accordance with one embodiment of the present invention. In one embodiment, after the processing of the wafer 102 has been completed, the temperature of the wafer processing environment can be decreased depending on the wafer processing operation. In such cases, the temperature of the fluid 160 being introduced into the bottom chamber 104b may be decreased. By lowering the temperature of the fluid in the bottom chamber 104b, the temperature of the wafer 102 may be decreased in an optimal manner. Again, as discussed above, the insulating material 140 may be optionally used. By usage of this insulating material the cool down period of the chamber 104 may be significantly less due to less amount of stored heat in the apparatus 100.

Figure 5:
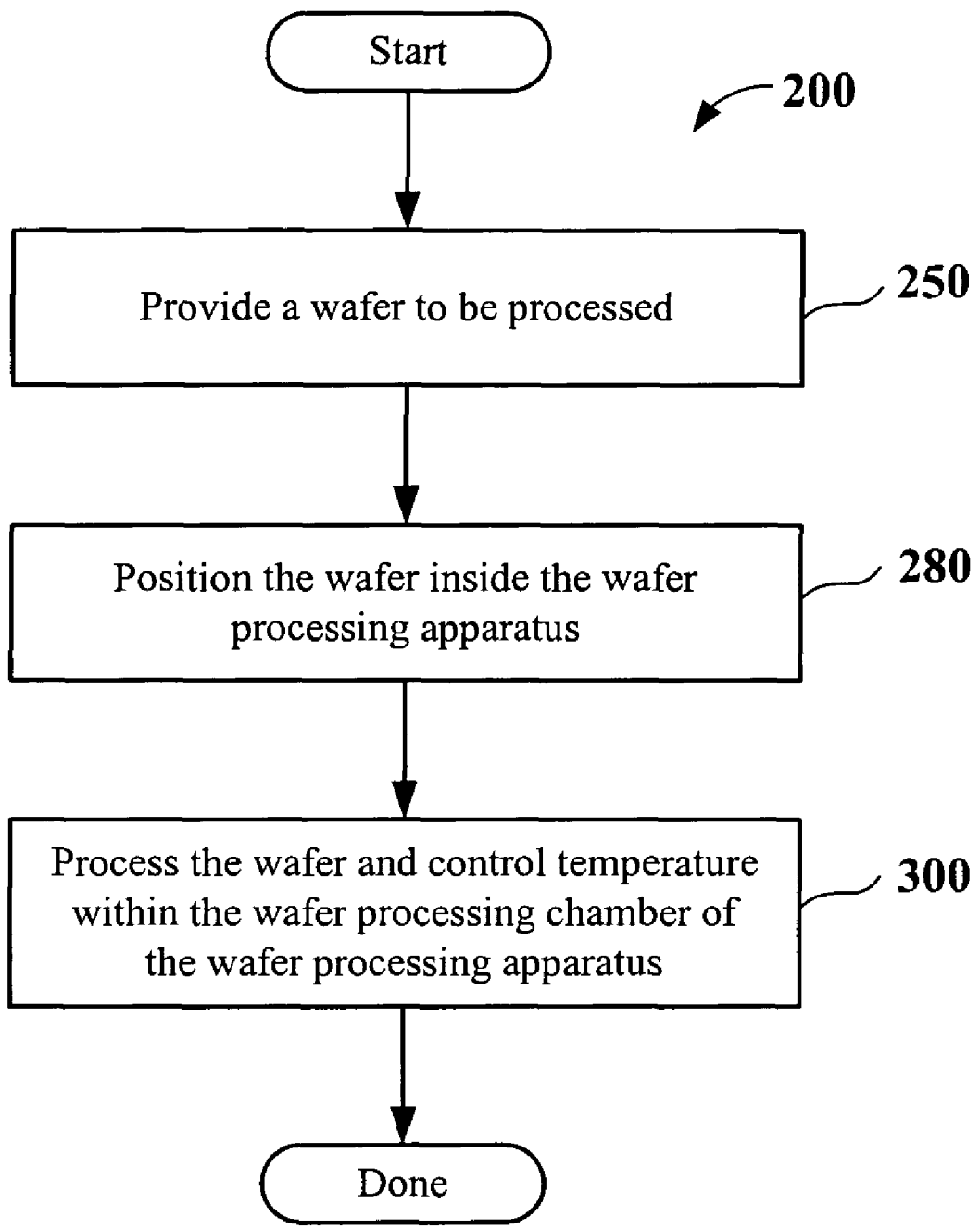
FIG. 5 shows a flowchart defining a method for processing a wafer using the wafer processing apparatus in accordance with one embodiment of the present invention.

FIG. 5 shows a flowchart 200 defining a method for processing a wafer using the wafer processing apparatus 100 in accordance with one embodiment of the present invention. It should be understood that the processes depicted in the flowchart 200 may be in a program instruction form written on any type of computer readable media. For instance, the program instructions can be in the form of software code developed using any suitable type of programming language. For completeness, the process flow of FIG. 5 will illustrate an exemplary process whereby a wafer is processed using controlled wafer temperature.

In one embodiment, the method begins with operation 250 where a wafer to be processed is provided. It should be appreciated that any suitable type and/or size of wafer (e.g., substrate) to be processed may be utilized such as, for example, 200 mm wafer, 300 mm etc. It should be appreciated that the wafer may be any suitable material such as, for example, silicon based materials.

After operation 250, the method moves to operation 280 where the wafer is positioned inside the wafer processing apparatus. In one embodiment, the wafer may be clamped within the wafer processing chamber of the wafer processing apparatus so the wafer is ready to be processed. It should be appreciated that the wafer may be positioned in any suitable manner as long as the wafer is stable and the top chamber and the bottom chamber of the wafer processing chamber may be separated. In one embodiment, the wafer is positioned within the processing chamber of the wafer processing apparatus so the wafer itself separates the processing chamber into a bottom chamber and a top chamber. In such an embodiment, a top surface of the wafer is exposed to the top chamber and the bottom surface of the wafer is exposed to the bottom chamber.

Then operation 300 processes the wafer and controls the temperature of the wafer processing chamber within the wafer processing apparatus. In one embodiment, processing fluid may be introduced into the top chamber so the top surface of the wafer is processed, and a temperature control fluid may be introduced into the bottom chamber so the fluid can be applied to the bottom surface of the wafer. In this embodiment, the controlling the temperature of the temperature control fluid can in turn control the wafer temperature. This may occur because the temperature control fluid can flow along the bottom surface of the wafer to change the wafer temperature. Operation 300 is described in further detail in reference to FIG. 6.

Figure 6:
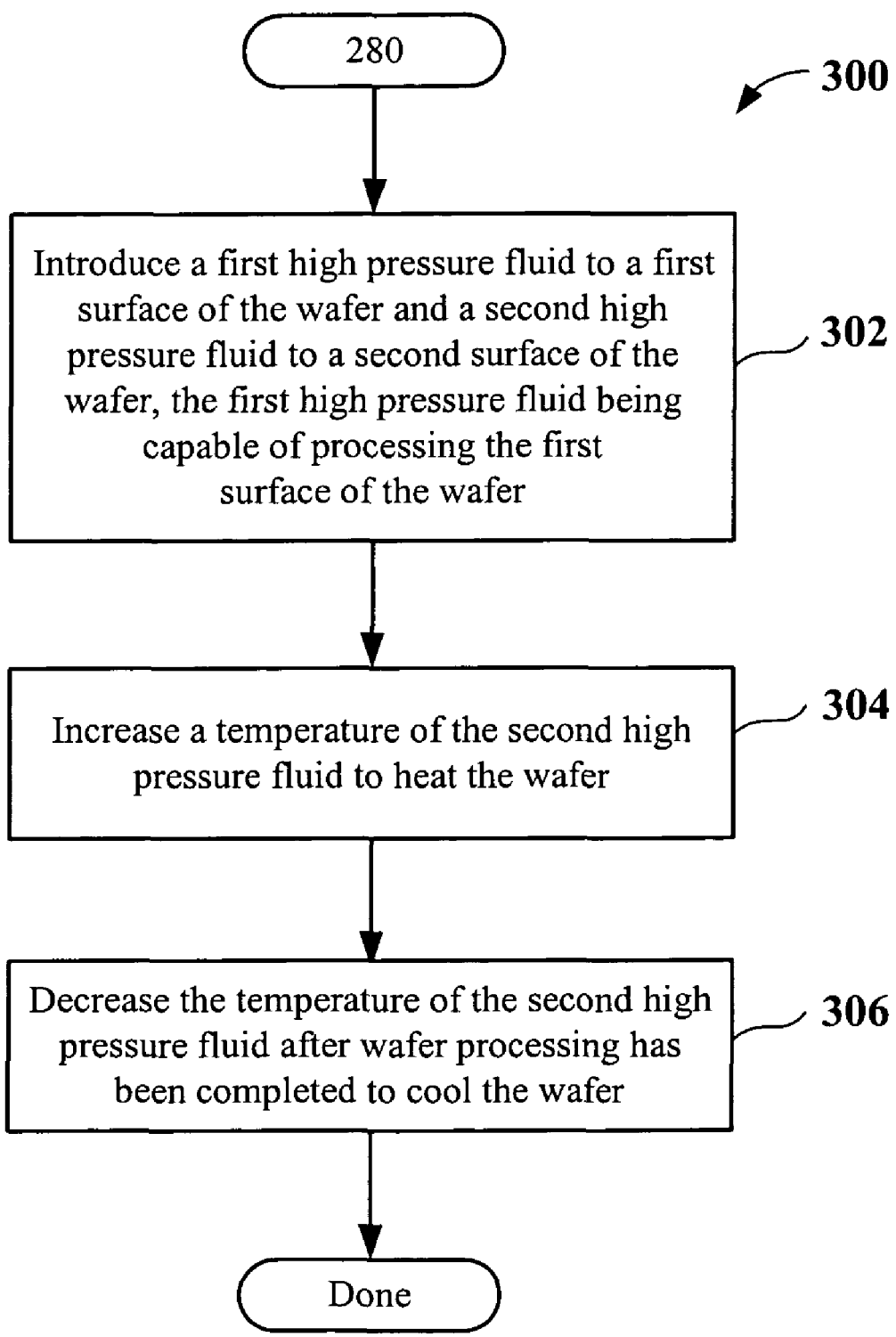
FIG. 6 shows a flowchart defining the processing of the wafer and controlling of the temperature of the wafer processing chamber within the wafer processing apparatus in accordance with one embodiment of the present invention.

FIG. 6 shows a flowchart 300 defining the processing of the wafer and controlling of the temperature of the wafer processing chamber within the wafer processing apparatus in accordance with one embodiment of the present invention. In one embodiment, the flowchart 300 begins with operation 302 which introduces a first high pressure fluid to a first surface of the wafer and a second high pressure fluid to a second surface of the wafer where the first high pressure fluid is capable of processing the first surface of the wafer. Operation 302 is described in further detail in reference to FIG. 7. After operation 302, the method advances to operation 304 which increases a temperature of the second high pressure fluid to heat the wafer. Then operation 306 decreases the temperature of the high pressure fluid after wafer processing has been completed to cool the wafer.

Figure 7:
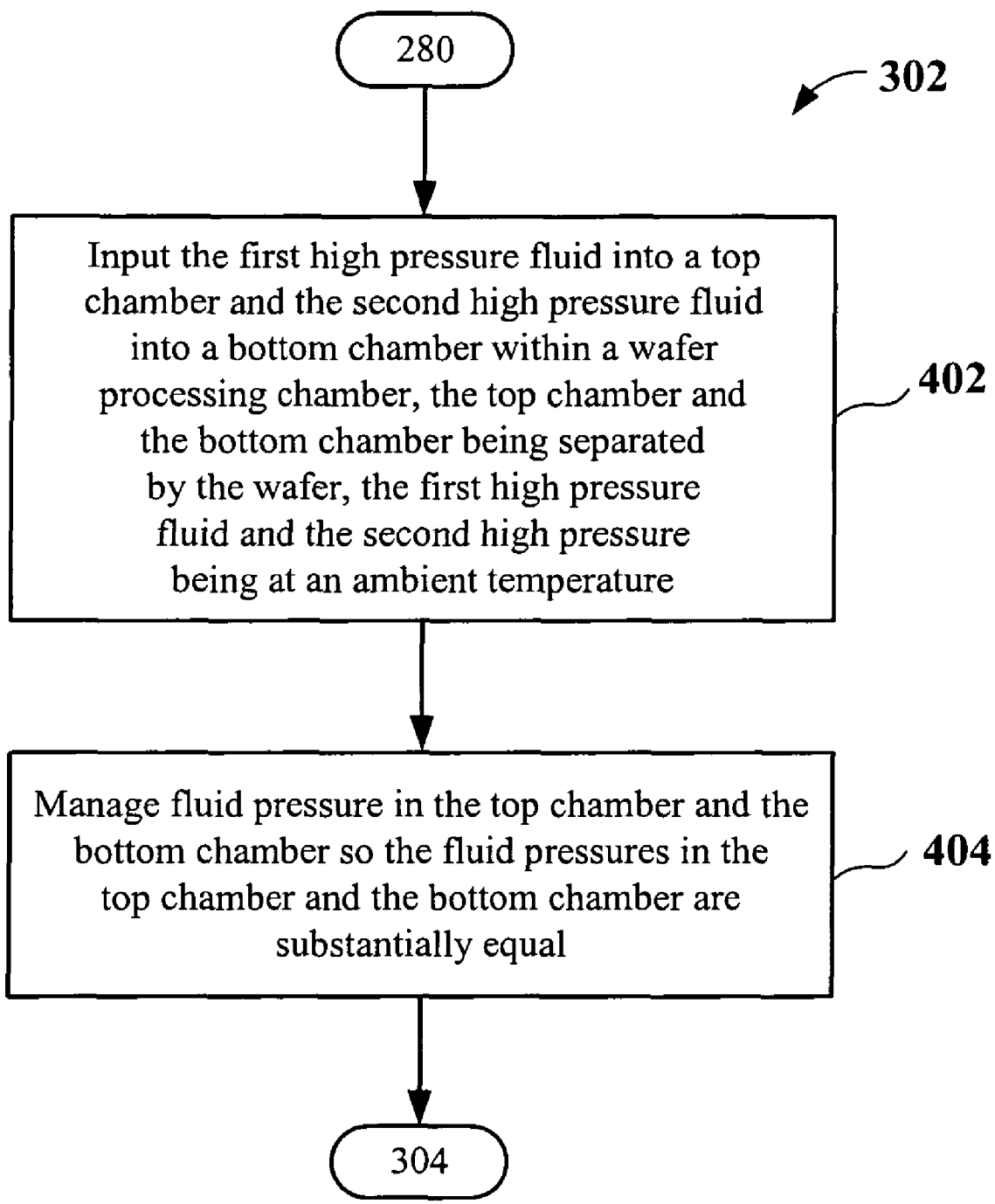
FIG. 7 illustrate a flowchart that defines the introducing of the first high pressure fluid to the first surface of the wafer and the second high pressure fluid to the second surface of the wafer in accordance with one embodiment of the present invention.

FIG. 7 illustrate a flowchart 302 that defines the introducing of the first high pressure fluid to the first surface of the wafer and the second high pressure fluid to the second surface of the wafer in accordance with one embodiment of the present invention. In one embodiment, the flowchart 302 begins with operation 402 which inputs the first high pressure fluid into a top chamber and the second high pressure fluid into a bottom chamber within a wafer processing chamber where the top chamber and the bottom chamber are separated by the wafer and the first high pressure fluid and the second high pressure fluid are at ambient room temperature. After operation 402, the method moves to operation 404 where the fluid pressure in the top chamber and in the bottom chamber are managed so the fluid pressures in the top chamber and the bottom chamber are substantially equal.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
a substrate processing chamber defined such that a flat joining surface defines the substrate processing chamber into a first chamber above the joining surface and a second chamber below the joining surface;
a plurality of first chamber inlets defined through and extending into the first chamber, the first chamber having a first space with a first radius and each of the first chamber inlets configured to input a first fluid of a first temperature into the first space at a first pressure;
a plurality of first chamber outlets defined through and extending into the first chamber, the plurality of first chamber outlets defined to remove the first fluid;
a plurality of second chamber inlets defined through and extending into the second chamber having a second space with a second radius, the second radius being less than the first radius and the joining surface defined to provide a support edge for the substrate when present, the first space and the second space being joined at the joining surface, wherein each of the second chamber inlets is configured to input a second fluid of a second temperature into the second space at a second pressure, wherein the first fluid does not intermingle with the second fluid when the substrate is on the support edge; and
a plurality of second chamber outlets defined through and extending into the second chamber, the plurality of second chamber outlets defined to remove the second fluid;
wherein the first pressure and the second pressure are substantially equal.

2. The apparatus as recited in claim 1, wherein the first chamber is a top chamber and the second chamber is a bottom chamber.

3. The apparatus as recited in claim 1, wherein the second temperature is higher than the first temperature.

4. The apparatus as recited in claim 1, wherein the first fluid is a substrate processing fluid and the second fluid is a substrate temperature controlling fluid.

5. The apparatus as recited in claim 1, wherein the first fluid pressure and the second fluid pressure are between about 2100 PSI to about 5000 PSI.

6. The apparatus as recited in claim 1, wherein the first fluid pressure and the second fluid pressure are in a range consistent with $CO_2$ in supercritical state.

7. The apparatus as recited in claim 1, wherein the first temperature is between about 20 degrees C. and about 100 degrees C. and the second temperature is between about the ambient room temperature and about 400 degrees C.

8. The apparatus as recited in claim 1, wherein the second temperature is between about the ambient room temperature and about 300 degrees C.

9. The apparatus as recited in claim 1, wherein the second temperature is capable of heating the substrate.

10. An apparatus for processing a substrate, comprising:
a substrate processing chamber defined such that a flat joining surface divides the substrate processing chamber into a top chamber above the joining surface and a bottom chamber below the joining surface, the top chamber having a top space with a top radius, and the bottom chamber having a bottom space;
an insulating material covering walls of the bottom space, the insulating material defining a bottom radius inside the insulating material, the bottom radius being less than the top radius, the insulating material defined to provide a support edge for the substrate when present;
a plurality of top chamber inlets configured to input a substrate processing fluid of a first temperature into the top space at a first pressure;
a plurality of top chamber outlets defined to remove the substrate processing fluid;
a plurality of bottom chamber inlets configured to input a substrate temperature controlling fluid of a second temperature into the bottom space at a second pressure, wherein the substrate processing fluid does not intermingle with the controlling fluid when the substrate is on the support edge, wherein the first pressure and the second pressure are substantially equal; and
a plurality of bottom chamber outlets defined to remove the substrate temperature controlling fluid.

11. The apparatus as recited in claim 10, wherein the second temperature is higher than the first temperature.

12. The apparatus as recited in claim 10, wherein the first pressure and the second pressure are between about 2100 PSI to about 5000 PSI.

13. The apparatus as recited in claim 10, wherein the first pressure and the second pressure are in a range consistent with CO.sub.2 in supercritical state.

14. The apparatus as recited in claim 10, wherein the first temperature is between about 20 degrees C. and about 100 degrees C. and the second temperature is between about the ambient room temperature and about 400 degrees C.

15. The apparatus as recited in claim 10, wherein the second temperature is between about the ambient room temperature and about 300 degrees C.

16. The apparatus as recited in claim 10, wherein the second temperature is capable of heating the substrate.

17. The apparatus as recited in claim 10, wherein the top chamber inlets and the top chamber outlets are defined on a perimeter of the top space.

18. The apparatus as recited in claim 17, wherein the bottom chamber inlets and the bottom chamber outlets are defined on a perimeter of the bottom space.

19. An apparatus for processing a substrate, comprising:
a substrate processing chamber defined such that a flat joining surface defines the substrate processing chamber into a first chamber above the joining surface and a second chamber below the joining surface;
a plurality of first chamber inlets defined through and extending into the first chamber, the first chamber having a first space with a first radius and each of the plurality of first chamber inlets configured to input a first fluid of a first temperature into the first space at a first pressure;
a plurality of first chamber outlets defined through and extending into the first chamber, the plurality of first chamber outlets defined to remove the first fluid;
a plurality of second chamber inlets defined through and extending into the second chamber having a second space with a second radius, the second radius being less than the first radius and the joining surface defined to provide a support edge for the substrate when present, the first space and the second space being joined at the joining surface, wherein each of the second chamber inlets is configured to input a second fluid of a second temperature into the second space at a second pressure, wherein the first fluid does not intermingle with the second fluid when the substrate is on the support edge; and
a plurality of second chamber outlets defined through and extending into the second chamber, the plurality of second chamber outlets defined to remove the second fluid;
wherein the first pressure and the second pressure are substantially equal,
wherein insulating material covering walls of the second space separates the second fluid from the walls of the second space.

20. The apparatus as recited in claim 19, wherein the second temperature is higher than the first temperature.

21. The apparatus as recited in claim 19, wherein the first fluid is a substrate processing fluid and the second fluid is a substrate temperature controlling fluid.

22. The apparatus as recited in claim 19, wherein the first pressure and the second pressure are between about 2100 PSI to about 5000 PSI.

23. The apparatus as recited in claim 19, wherein the first pressure and the second pressure are in a range consistent with CO.sub.2 in supercritical state.

* * * * *